United States Patent [19]
Borg et al.

[11] 3,945,003
[45] Mar. 16, 1976

[54] MULTI-LEVEL TELEVISION RECEIVER CHANNEL INDICIA DISPLAY

[75] Inventors: Arthur N. Borg; Bruce E. Smith, both of Fort Wayne, Ind.

[73] Assignee: The Magnavox Company, Fort Wayne, Ind.

[22] Filed: Apr. 23, 1974

[21] Appl. No.: 461,666

[52] U.S. Cl. ............. 340/377; 116/124.4; 315/135; 315/205; 340/271; 340/332
[51] Int. Cl.².......................................... G08B 5/36
[58] Field of Search........ 340/271, 332, 335, 378 R, 340/380, 377; 116/124.4, DIG. 29, DIG. 30, DIG. 31; 315/135, 205

[56] References Cited
UNITED STATES PATENTS

| | | |
|---|---|---|
| 2,103,334 | 12/1937 | McWeeny............................ 340/377 |
| 2,746,029 | 5/1956 | Pfund.............................. 340/271 X |
| 3,138,737 | 6/1964 | French............................. 315/205 X |
| 3,836,911 | 9/1974 | Gibson et al........................ 340/380 |

*Primary Examiner*—David L. Trafton
*Attorney, Agent, or Firm*—William J. Streeter; Thomas A. Briody; Joe E. Barbee

[57] ABSTRACT

A channel number display device for a television receiver for displaying the numerals of the channel to which the receiver is tuned with the display being initially bright immediately after a channel change, and then after a predetermined time of several seconds, being reduced in brightness so as not to distract from the program material. Through the use of a thyristor, regardless of the number of individual elements in the numerical display, the brightness levels may be held to predetermined quantities.

5 Claims, 3 Drawing Figures

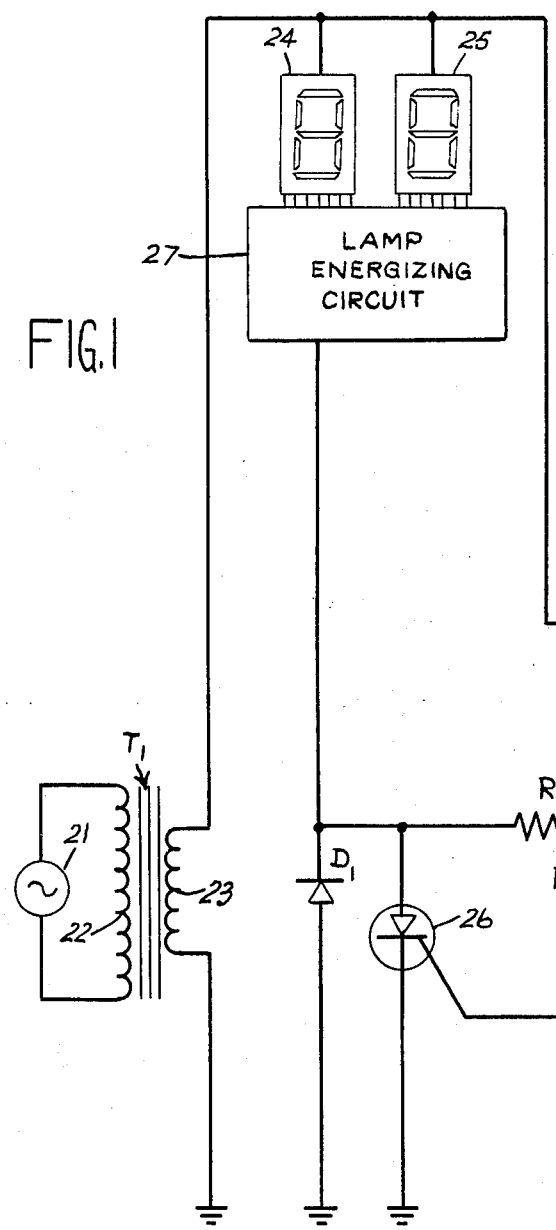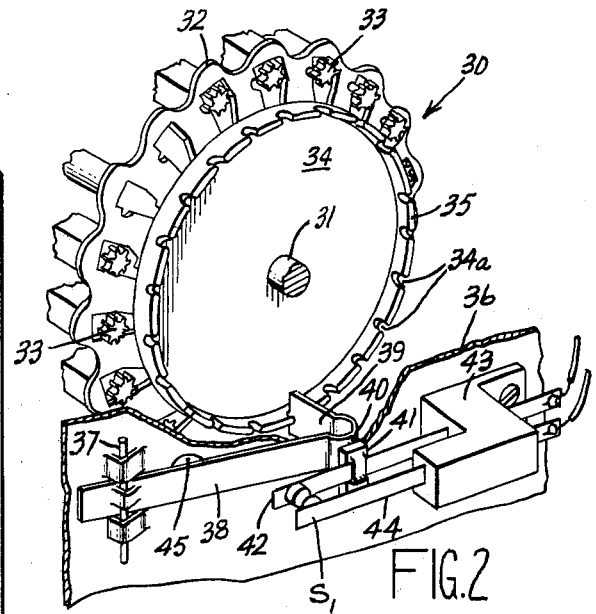

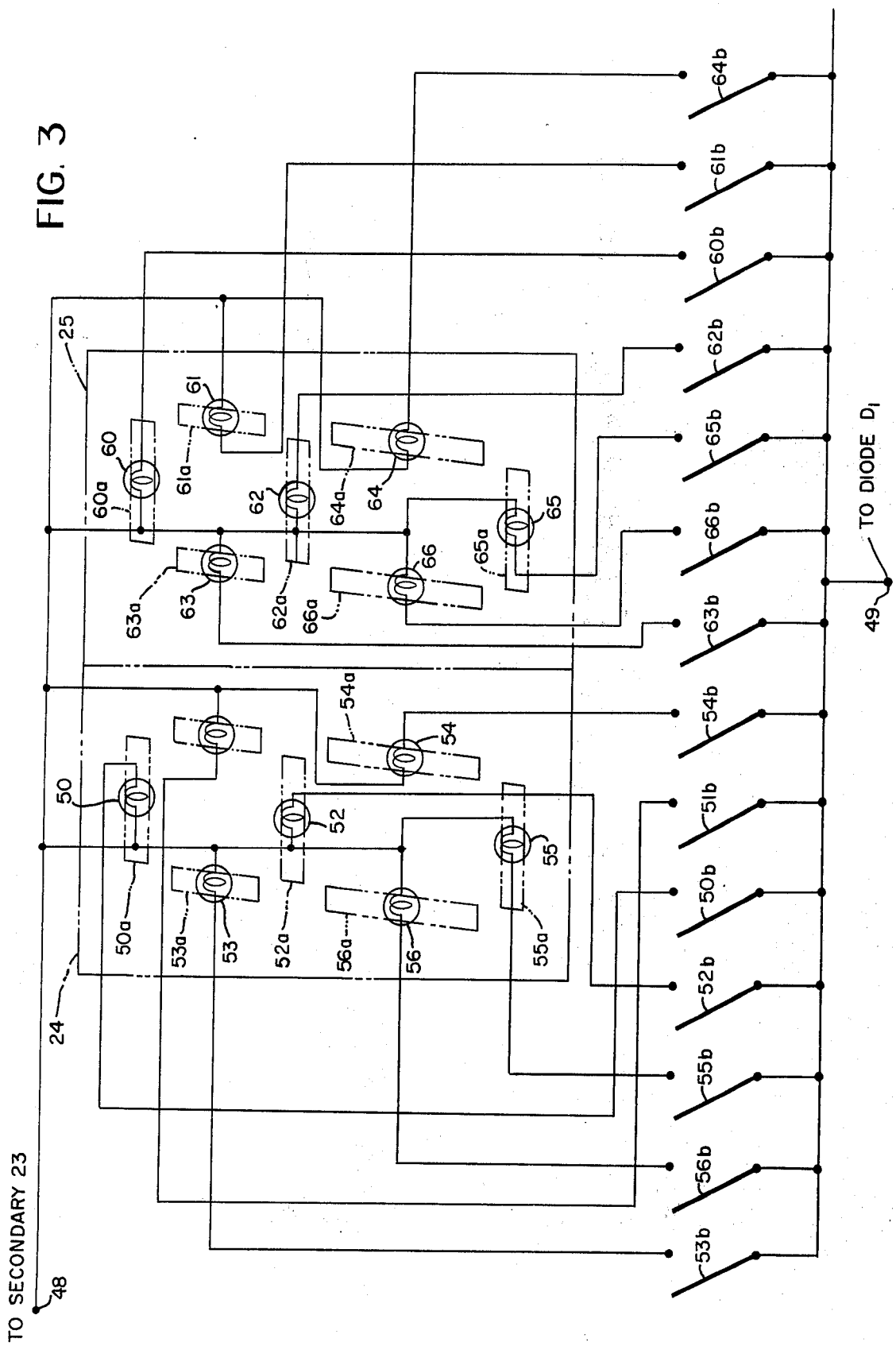

MULTI-LEVEL TELEVISION RECEIVER CHANNEL INDICIA DISPLAY

BACKGROUND OF THE INVENTION

Over the years, it has been a desire of television manufacturers to provide a display of the channel numbers on the television receiver so that they can be easily read, especially immediately after tuning to a new station so that the viewer can determine if he is at the desired station. This is especially true for television receivers having remote control, wherein the viewer is spaced at the viewing distance from the receiver while tuning to a new station. Various efforts to accomplish this display in the past have been largely unsuccessful due to cost or inefficient displays. While it has been a goal to initially illuminate the channel number display at a relatively bright level, and later diminish the brightness in order to cause a minimum distraction from the receiver picture, previous methods have not been in common use due to expense and complexity or to devices which were ineffective.

SUMMARY OF THE INVENTION

This invention overcomes the above problems by providing a seven-segment units digital display member and a seven-segment tens digit display member, each of which have seven individual illuminating elements arranged to display all 10 numerals upon selective illumination of the segments. The segments are arranged so that when they are all illuminated and by selective illumination of the segments, all ten numerals can be depicted. Having a tens digit and a units display permits display of all VHF and UHF channel numbers. The segment-illuminating bulbs are connected in parallel, and the more segments that are illuminated, the more current is drawn.

An alternating current supply is connected to the segment bulbs, and during normal operation, is half-wave rectified so that only one-half of the AC voltage is used to illuminate the bulbs, resulting in a low-level illumination. However, everytime the television tuner is changed from one channel to another, the illumination of the bulbs is increased, regardless of which channel number is selected and the number of bulbs energized, for a predetermined time period, so that immediately after a channel change, the viewer is presented with a bright representation of the new channel number. After several seconds, the light level diminishes to a low level of illumination so that while the channel numerals are illuminated, they are done so at a lower level which will not distract from viewing of the receiver screen.

In order to accomplish the above, a thyristor is connected in parallel to the above-mentioned half-wave rectifying diode and poled in the opposite direction so that when it conducts, full-wave voltage will be delivered to the segment bulbs for increased illumination. Also, due to the low resistance characteristic of the thyristor, adequate current is available regardless of the number of bulbs illuminated so that the same level of illumination is achieved regardless of the numeral displayed. The trigger circuit for the thyristor is a resistance capacitance combination having a time constant of several seconds which operates through a transistor to turn on the thyristor. Initially, the capacitance is fully charged; and everytime a channel change is effected, a switch momentarily discharges the capacitor, saturating the transistor, and triggering the thyristor. Since the condenser discharge is momentary, it immediately starts to recharge; and when it reaches its charged state, the transistor is biased off, and the thyristor is turned off, thereby reestablishing the normal half-wave power to the illuminating segments. These and other objects and advantages will become more apparent when a preferred embodiment is discussed in connection with the drawings.

BRIEF DESCRIPTION OF DRAWINGS

FIG. 1 is a schematic partially-block diagram of a preferred embodiment of this invention showing the electrical circuitry to achieve the multi-level illumination of the display lamps;

FIG. 2 is a partial perspective view of the mechanical switch actuating member shown in FIG. 1; and FIG. 3 is a schematic showing of the display lamps.

An AC supply 21 is connected to the primary 22 of transformer T-1. The secondary 23 of transformer T-1 is connected through channel display lamps 24, 25, through lamp energizing circuit 27 shown in block-diagram form and through diode D-1 to ground. Lamps 24 and 25 are 7-segment lamps, well known in the art, and may take the form of those lamps shown in Pat. No. 3,758,973 to Gary L. Miller entitled, "One-Piece Character Display Device" issued Sept. 18, 1973. Briefly, each of these lamps consists of seven separate segments connected in parallel: the segments are arranged in the form of a figure 8, and when they are all illuminated, the figure 8 is displayed. Each numeral from 0 through 9 may be displayed by selective illumination of the segments. The circuitry of block 27 is utilized for such selective illumination and may take the form of that shown in the application Ser. No. 461,665, filed Apr. 23, 1974, and now Pat. No. 3,937,877, entitled, "Position Indicating Device", inventor: Hein Vodinh, co-pending herewith, and having a common assignee, which is incorporated by reference herein. For example, conductive strips 50 of circuit boards 48, 48a of Vodinh circuit may be connected, respectively, to the segments of lamps 24, 25 while ground strips 51 of boards 48, 48a may be connected to the cathode of diode D-1.

Secondard 23 also operates through diode D-2 and resistance R-3 to charge capacitor C-1 with half-wave power. Switch S-1 is in parallel with capacitor C-1 and is normally open but is closed momentarily, to discharge capacitor C-1 each time a channel selection is made in a TV receiver.

The discharge path of capacitor C-1 is through resistor R-4 to ground and resistor R-6 which is connected to the base of PNP transistor Q-1. The emitter of transistor Q-1 is connected to voltage divider resistor R-1 and R-2 while the collector of Q-1 is connected to ground through resistance R-5. A thyristor 26, its control electrode connected to the collector of Q-1, is connected in parallel with diode D-1 but poled in the opposite direction so that when thyristor 26 is saturated, full-wave power will be applied to channel display lamps 24 and 25. Due to the very low internal resistance of thyristor 26, and the parallel connection of the segments in both lamp 24 and lamp 25, regardless of how many of the segments of lamps 24 and 25 are illuminated, each segment will get substantially the same amount of current so that the brightness will be substantially the same whether all the segments are illuminated or just two.

FIG. 3 is a schematic illustrating the parallel connection of display lamps 24, 25. Terminal 48 is connected to secondary winding 23 and terminal 49 is connected to the cathode of diode D-1. Lamp 24 has individual lamps 50–56 which are located behind slots 50a–56a respectively. One terminal of each of bulbs 50–56 is connected to terminal 48, and the other is connected respectively to switches 50b–56b, which in turn are connected to terminal 49. When the switches are closed, a completed connection is made to illuminate the bulbs. As mentioned, the switches are selectively closed to illuminate numerals 0–9.

In the same manner, the bulbs 60–66 in display 25 are connected through switches 60b–66b to terminal 49 for selective illumination depending on switch position.

The mechanism for closing switch 1 is shown in FIG. 2. In FIG. 2 is shown a partial view of tuner assembly 30 having tuning shaft 31 rotated by a manually or motor operable knob, not shown, which may be actuated by the viewer to the desired channel. Shaft 31 is also connected to tuner mechanism, not shown, which tunes the receiver to the selected channel. Connected to and rotatable with shaft 31 is tuning screw housing 32 which carries tuning screws 33 which axially protude from the housing 32, and each tuning screw corresponds to a predetermined channel and is adapted to fine tune that channel by mechanism which is well known in the art and is not shown. Also connected to and rotatable with shaft 31, is switch cam disc 34 which has a plurality of notches 34a in the peripheral ridge 35 thereof, with a notch corresponding to a channel which can be tuned by the TV receiver.

A mounting plate 36, in fixed relationship to the TV chassis, rotatably supports pivot pin 37 which is also rotatably engaged with link arm 38 so that arm 38 can pivot about pivot pin 37. Arm 38 has slot-tab 39 formed at the end thereon which registers with the slots 34 and has a switch contact 40 which registers with switch pad 41 on spring arm 42 which is cantilevered in housing 43, also fixed to mounting plate 36. Spring arm 42 is sprung to urge tab 39 into slot 34 and is also urged away from switch arm 44 which is also cantilevered from block 43. Switch arms 42 and 44 from switch S-1, shown in FIG. 1, which is normally electrically open. Link arm 38 has an insulative pad 45 which is in registration with the ends of tuning screws 33 and comes into contact with screws 33 as shaft 31 is rotated. Upon contact between pad 45 and a tuner screw 33, arm 38 is raised, unseating tab 39 from slots 34, and at the same time, momentarily closing switch S-1 by urging switch arm 42 into contact with switch arm 44. When a channel is selected, pad 45 is between screws 33 so that tab 39 is in a slot 34 and switch S-1 is open. However, when tuner shaft 31 is rotated and channel selection is in process, pad 45 comes into sequential contact with each of tuning screws 33 until a channel has been selected, causing contact 40 to move against switch pad 41 and close S-1 against the spring force of arm 42.

Resistors R-1 and R-2 set up a voltage divider network for the Q-1 emitter. Resistor R-1 also acts as the thyristor gate current limiting resistor while R-5 is the thyristor 26 gate cathode resistor. Resistor R-6 limits the base current of Q-1 and provides for capacitor C-1 discharge.

OPERATION

In operation under normal circumstances when tuner shaft is located in a channel selected position to receive a program on a television channel, the channel display lamps 24 and 25 are in the dim mode due to the fact that they are receiving half-wave rectification of the power from secondard 23 by virtue of diode D-1 conducting but thyristor 26 being non-conductive. Also, at this time, capacitor C-1 is being charged through diode D-2 and resistor R-3. During a channel change, which is accomplished by rotation of tuner shaft 31, link arm assembly 38 is raised due to contact between insulative pad 45 and the ends of tuning screws 33, closing switch S-1 by moving switch arms 42 and 44 into contact every time a tuning screw 33 is contacted by pad 45. Every time switch S-1 is closed, capacitor C-1 discharges causing the base voltage of PNP transistor Q-1 to be lowered until Q-1 saturates raising the voltage at resistor R-5 triggering thyristor 26 into conduction. At this time, channel display lamps 24, 25 receive full-wave AC voltage developed in secondary 23 causing the lamps to considerably brighten making channel display lamps 24, 25 move visible. Due to the low internal resistance of thyristor 26, regardless of the number of segments 50–56 and 60–66 in the channel display lamps that are illuminated, the current in the segments is approximately the same, and therefore, the brightness is approximately the same. The full-wave continues until capacitor C-1 becomes recharged raising the potential at the base of Q-1 to take transistor Q-1 out of saturation lowering the voltage at resistor R-5, whereby thyristor 26 loses its gate trigger current. The channel display lamps now receive half-wave rectified power from secondary 23. The time constant which determines the length of time the channel display lamps receive the brighter illumination is provided by time delay circuit of R-3, R-4, R-6, and C-1. This time is normally several seconds but may be adjusted to any predetermined time duration. This process is repeated by grounding the timing control line by way of closing switch S-1.

Component values in a circuit which has been found to provide satisfactory results are as follows:

| | |
|---|---|
| R-1 | 12 kilohms |
| R-2 | 6800 ohms |
| R-3 | 82 kilohms |
| R-4 | 220 kilohms |
| R-5 | 1200 ohms |
| R-6 | 47 kilohms |
| D-1 | silicon diode |
| C-1 | microfarads |
| Q-1 | 134P1 Transistor |
| thyristor 26 | GE C106 |

The above embodiment of this invention is used in The Magnavox Company chassis No. T-989.

While the above shows a preferred embodiment of this invention, many modifications, which follow the teachings of this invention, will occur to one skilled in the art. The scope of this invention is, therefore, defined by the following claims.

We claim:

1. Television channel display apparatus comprising:
   a seven-segment units digit display member and a seven-segment tens digit display member, each member having seven individual illuminating segments arranged to display all ten numerals upon selective segment energization;
   said selectively energized illuminating segments being connected in parallel;
   an alternating current supply circuit being connected across each of said display members to energize said segments;

rectifying means being in said supply circuit to half-wave rectify the power supplied to said display members;

thyristor means connected across said rectifying means to supply full-wave power to said display means when triggered into conduction;

a triggering circuit for said thyristor means having a transistor, and an RC circuit, said transistor being biased to saturation upon discharge of the capacitor of said RC circuit to trigger said thyristor means on;

switch means to discharge said capacitor upon each channel change and;

said capacitor being connected to said power supply through the resistor of said RC circuit to become sufficiently charged after a predetermined time to bias said transistor out of saturation and turn off said thyristor means.

2. Television channel display apparatus comprising:

a character display device having a plurality of illuminable segments, each segment being selectively illuminable by electrical energization thereof and illuminable at different levels of illumination corresponding to different levels of energization;

means for selectively energizing said segments in combinations to display characters;

switch means;

time control means responsive to said switch means for providing a control signal for a predetermined time; and level control means responsive to said control signal for energizing said selectively energized segments at a higher level for said predetermined time and at a lower level at other times.

3. The apparatus of claim 2 wherein said character display device comprises two seven-segment character displays, one for displaying a units digit and one for displaying a tens digit to display the number of selected television channels.

4. The apparatus of claim 2 further comprising channel tuning apparatus and wherein said switch means comprises a momentary contact switch coupled to the tuning apparatus and operable whenever the tuning is changed from a previously selected channel.

5. The invention of claim 2 wherein said level control comprises a rectifier and a thyristor connected in parallel and oppositely poled to pass half-wave power to said display device when said thyristor is not triggered and to pass full-wave power to said display device when said thyristor is triggered.

* * * * *